United States Patent
Hall et al.

(10) Patent No.: US 12,136,923 B2
(45) Date of Patent: Nov. 5, 2024

(54) SUPERCONDUCTING CIRCUIT MULTI-CHIP SYNCHRONIZATION SYSTEM

(71) Applicants: Jeffrey S. Hall, Annapolis, MD (US);
Jonathan D. Egan, Hanover, MD (US);
Joseph A. Payne, Cooksville, MD (US)

(72) Inventors: Jeffrey S. Hall, Annapolis, MD (US);
Jonathan D. Egan, Hanover, MD (US);
Joseph A. Payne, Cooksville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 60 days.

(21) Appl. No.: 18/177,299

(22) Filed: Mar. 2, 2023

(65) Prior Publication Data

US 2024/0297651 A1 Sep. 5, 2024

(51) Int. Cl.
*H03L 7/06* (2006.01)
*G06N 10/40* (2022.01)
*H03K 3/03* (2006.01)
*H03K 17/92* (2006.01)

(52) U.S. Cl.
CPC ............... *H03L 7/06* (2013.01); *G06N 10/40* (2022.01); *H03K 3/0315* (2013.01); *H03K 17/92* (2013.01)

(58) Field of Classification Search
CPC .......................................................... H03L 7/06
USPC ............................................................ 327/144
See application file for complete search history.

(56) References Cited

U.S. PATENT DOCUMENTS

| | | | | |
|---|---|---|---|---|
| 9,497,017 B1 * | 11/2016 | Kim | ...................... | G01R 33/035 |
| 11,231,742 B1 * | 1/2022 | Cherif | ........................ | G06F 1/10 |
| 2024/0005986 A1 * | 1/2024 | Reohr | .................. | G11C 7/1066 |

* cited by examiner

*Primary Examiner* — Tomi Skibinski
(74) *Attorney, Agent, or Firm* — Tarolli, Sundheim, Covell & Tummino LLP

(57) ABSTRACT

One example includes a superconducting circuit chip. The chip includes superconducting circuitry that operates based on a clock signal. The chip also includes a ring oscillator configured to receive a synchronization signal from a ring oscillator associated with another superconducting circuit chip. The ring oscillator is also configured to provide a trigger signal to the superconducting circuitry at a given phase of the clock signal relative to a phase of the clock signal of a trigger signal associated with the other one of the superconducting circuit chips based on the synchronization signal.

20 Claims, 3 Drawing Sheets

SUPERCONDUCTING CIRCUIT MULTI-CHIP SYNCHRONIZATION SYSTEM

GOVERNMENT INTEREST

The invention was made under Government Contract. Therefore, the US Government has rights to the invention as specified in that contract.

TECHNICAL FIELD

The present invention relates generally to computer systems, and specifically to a superconducting circuit multi-chip synchronization system.

BACKGROUND

Modern computer systems implement many different circuits that reside on different chips across one or more circuit boards. A clock signal is typically provided to the different chips to provide timing for operations of the circuit. Multi-chip computer systems are typically designed to operate and communicate with each other, such that synchronization of the timing of the chips, such as via the clock signal(s), allows operations of the computer system to be implemented quickly and efficiently. The synchronization of the timing of the chips can be such that operations can be performed on the same clock cycle or within a known number of clock cycles of operations provided from other chips. Such synchronization can become challenging as clock speeds increase in frequency. As an example, superconducting computer systems can implement very high speed pulses and high frequency clock signals, but it is still desirable to implement synchronization of different superconducting circuit chips.

SUMMARY

One example includes a superconducting circuit chip. The chip includes superconducting circuitry that operates based on a clock signal. The chip also includes a ring oscillator configured to receive a synchronization signal from a ring oscillator associated with another superconducting circuit chip. The ring oscillator is also configured to provide a trigger signal to the superconducting circuitry at a given phase of the clock signal relative to a phase of the clock signal of a trigger signal associated with the other one of the superconducting circuit chips based on the synchronization signal.

Another example includes a method for synchronizing a plurality of superconducting circuit chips to a clock signal. The method includes providing an initialization signal to a first ring oscillator associated with a first superconducting circuit chip comprising first superconducting circuitry that operates based on the clock signal. The method also includes generating a first trigger signal to the first superconducting circuitry at a first phase of the clock signal via the first ring oscillator. The method also includes providing a synchronization signal from the first ring oscillator to a second ring oscillator associated with a second superconducting circuit chip comprising second superconducting circuitry that operates based on the clock signal. The method further includes providing a second trigger signal to the second superconducting circuitry at the first phase of the clock signal via the second ring oscillator based on the synchronization signal.

Another example includes a superconducting circuit synchronization system. The system includes a first superconducting circuit chip comprising first superconducting circuitry that operates based on a clock signal and a first ring oscillator. The first ring oscillator can be configured to provide a synchronization signal and a first trigger signal. The first trigger signal can be provided to the first superconducting circuitry at a given phase of the clock signal. The system also includes a second superconducting circuit chip comprising second superconducting circuitry that operates based on the clock signal and a second ring oscillator. The second ring oscillator can be configured to receive the synchronization signal and to provide a second trigger signal. The second trigger signal can be provided to the second superconducting circuitry at the given phase of the clock signal based on the synchronization signal. The system further includes a synchronization controller configured to provide an initialization signal to the first ring oscillator of the first the superconducting circuit chip to activate the first ring oscillator.

DETAILED DESCRIPTION

Figure 1:
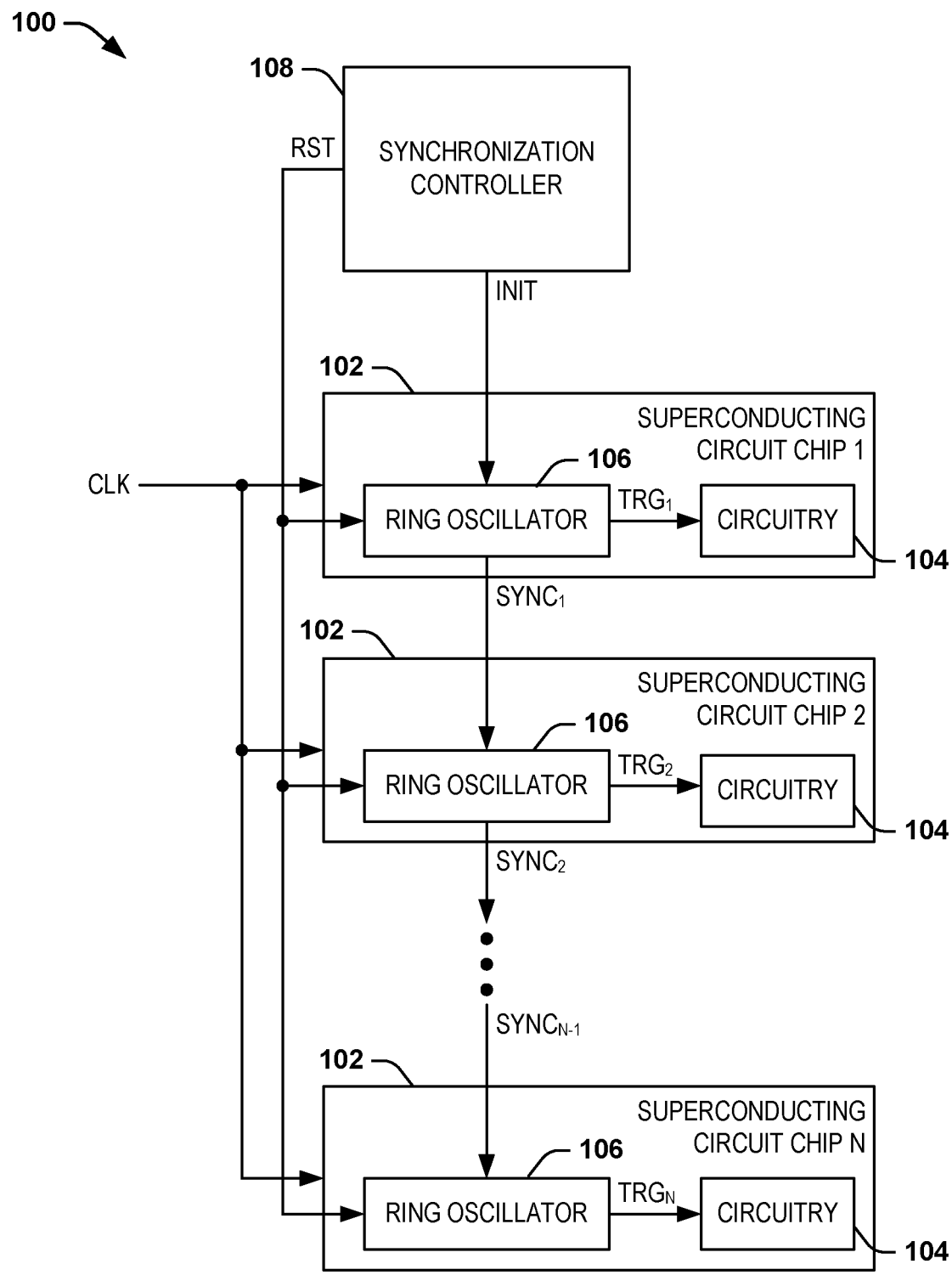
FIG. 1 illustrates an example block diagram of a superconducting circuit system.

The present invention relates generally to computer systems, and specifically to a superconducting circuit multi-chip synchronization system. A superconducting circuit system can include a plurality of superconducting circuit chips that each include superconducting circuitry configured to implement a circuit function based on a clock signal. As an example, the superconducting circuit system can be configured as a reciprocal quantum logic (RQL) system, such that the clock signal can be an RQL quadrature clock that operates at each of 90° increments. Each of the superconducting circuit chips can also include a ring oscillator that is implemented for synchronization of the superconducting circuit system. As an example, the ring oscillator of each of the superconducting circuit chips can include a plurality of Josephson transmission line (JTL) segments that are arranged in a loop to propagate a fluxon (e.g., an RQL pulse that includes a fluxon and an anti-fluxon) about the loop.

As an example, the superconducting circuit chips can be interconnected via passive transmission lines (PTLs) that propagate synchronization signals between the ring oscillators of the respective superconducting circuit chips. Therefore, the ring oscillator of a given superconducting circuit chip can be configured to receive a first synchronization signal from the ring oscillator of a first other superconducting circuit chip, and can transmit a second synchronization signal to the ring oscillator of a second other superconducting circuit chip. The synchronization signals can be provided to and can initialize a given ring oscillator at a known phase of the clock signal, thereby providing a relative propagation of the fluxon in each of the ring oscillators at a relative phase relationship in each of the superconducting circuit chips. The synchronization signals can propagate on the PTLs based on a known phase relationship with respect to the clock signal, and can be both transmitted from and received at the respective ring oscillators at known phases of the clock signal.

Each of the ring oscillators is also configured to provide a trigger signal to the superconducting circuitry of the respective superconducting circuit chip. Based on the arrangement of the ring oscillator (e.g., based on the arrangement of the JTL segments in the ring oscillator), the trigger signal can be provided at a known phase relationship with respect to the received synchronization signal. Therefore, based on a phase relationship between when a given synchronization signal is generated from a first ring oscillator and is received at a second ring oscillator, the first and second ring oscillators can provide the respective trigger signals at a known phase relationship with respect to each other. For example, the trigger signals can be provided at the same phase of the clock signal, such as concurrently. Accordingly, the trigger signals can provide synchronized circuit functions of the superconducting circuitry.

FIG. 1 illustrates an example block diagram of a superconducting circuit system 100. The superconducting circuit system 100 can be implemented in any of a variety of computing applications, such as including both superconducting and classical computing environments. The superconducting circuit system 100 includes a plurality N of superconducting circuit chips 102, where N is a positive integer. Each of the superconducting circuit chips 102 includes superconducting circuitry ("CIRCUITRY") 104 that is configured to perform a computer function based on a clock signal, demonstrated in the example of FIG. 1 as a clock signal CLK. As an example, the superconducting circuit system 100 can be configured as a reciprocal quantum logic (RQL) system, such that the clock signal CLK can be an RQL quadrature clock that operates at each of 90° increments, or in increments therebetween (e.g., 45°). In the example of FIG. 1, the clock signal CLK is thus demonstrated as being provided to each of the superconducting circuit chips 102.

Each of the superconducting circuit chips 102 also includes a ring oscillator 106. The ring oscillator 106 of each of the superconducting circuit chips 102 can be arranged similarly with respect to each other to provide a respective timing reference for each of the superconducting circuit chips 102 based on the clock signal CLK. As an example, the ring oscillators 106 can each include a plurality of Josephson transmission line (JTL) segments arranged in a loop, such that the JTL segments can propagate a fluxon about the loop based on the clock signal CLK. For example, the JTL segments can propagate an RQL fluxon and a corresponding RQL anti-fluxon about the loop based on the clock signal. In the example of FIG. 1, the ring oscillator 106 of each of the superconducting circuit chips 102 is configured to provide a trigger signal, demonstrated as trigger signals $TRG_1$ through $TRG_N$, to the superconducting circuitry 104 of the respective one of the superconducting circuit chips 102. As described herein, the trigger signals $TRG_1$ through $TRG_N$ can be provided in a manner that is synchronized to known phases of the clock signal CLK. As an example, the trigger signals $TRG_1$ through $TRG_N$ can be synchronized to a same phase of the clock signal CLK, such as provided concurrently.

The superconducting circuit system 100 also includes a synchronization controller 108 that is configured to initiate synchronization of the superconducting circuit chips 102, as described herein. As an example, the synchronization controller 108 can be provided in a room-temperature environment while the superconducting circuit chips 102 can be provided in a cryogenic superconducting environment (e.g., less than 10 Kelvin). The synchronization controller 108 is configured to provide an initialization signal INIT to the ring oscillator 106 of the first superconducting circuit chip ("SUPERCONDUCTING CIRCUIT CHIP 1") 102. The initialization signal INIT is thus configured to activate the ring oscillator 106 to generate the fluxon that propagates about the loop formed by the ring oscillator 106. In the example of FIG. 1, the ring oscillators 106 are configured to provide synchronization signals SYNC to ring oscillators 106 of other superconducting circuit chips 102 in a sequence. The synchronization signals SYNC are demonstrated as a first synchronization signal $SYNC_1$ provided from the ring oscillator 106 of the first superconducting circuit chip 102 to the ring oscillator 106 of the second superconducting circuit chip ("SUPERCONDUCTING CIRCUIT CHIP 2") 102, a second synchronization signal $SYNC_2$ provided from the ring oscillator 106 of the second superconducting circuit chip 102 to the ring oscillator 106 of a third superconducting circuit chip 102, to a last synchronization signal $SYNC_{N-1}$ provided from the ring oscillator 106 of the N−1 superconducting circuit chip 102 to the Nth superconducting circuit chip ("SUPERCONDUCTING CIRCUIT CHIP N") 102. Similar to the initialization signal INIT, each of the synchronization signals SYNC is configured to activate the ring oscillator 106 to which it is sent to generate the fluxon that propagates about the loop formed by the respective ring oscillator 106.

In addition to activating the ring oscillator 106 of the superconducting circuit chip 102 to which it is sent, each of the synchronization signals SYNC can provide a timing reference for the ring oscillator 106 to which it is sent relative to the ring oscillator 106 from which it is sent based on the clock signal CLK. As an example, a synchronization signal SYNC can be provided from a ring oscillator 106 of a superconducting circuit chip 102 at a given phase of the clock signal CLK, and can be received by the ring oscillator 106 of the next superconducting circuit chip 102 in the sequence at another given phase (e.g., the same or different) of the clock signal CLK. As another example, the synchronization signals SYNC can be sent on passive transmission lines (PTLs) that have respective lengths that can be associated with the phases of the clock signal CLK. Therefore, the length of the PTLs can be determinative of the phase of the clock signal CLK at which the synchronization signal SYNC is received at the ring oscillator 106 of a superconducting circuit chip 102. Accordingly, the timing relationship of each of the ring oscillators 106 can be determined relative to each other. As a result, the trigger signals $TRG_1$ through $TRG_N$ can be synchronized with respect to timing of the phases of the clock signal CLK. As a result, the trigger signals $TRG_1$ through $TRG_N$ can be provided at known phase timing of the clock signal CLK with respect to each other, such as concurrently.

In the example of FIG. 1, the synchronization controller 108 is further configured to provide a reset signal RST to the ring oscillator 106 of each of the superconducting circuit chips 102. The reset signal RST can be configured to deactivate the ring oscillators 106 of the respective superconducting circuit chips 102. As an example, the reset signal RST can be provided during a reset of the superconducting circuit system 100, such as to troubleshoot or clear fault situations. The superconducting circuit system 100 can thus subsequently be restarted, and the initialization signal INIT can be provided to re-establish synchronization of the superconducting circuit chips 102.

Based on the operation of the ring oscillators 106 and the a priori known relative timing relationship between the ring oscillators 106 in response to the synchronization signals SYNC, the trigger signals $TRG_1$ and $TRG_N$ can be implemented by the superconducting circuitry 104 to provide the circuit functions in a manner that can be synchronized across the superconducting circuit chips 102. Accordingly, the superconducting circuit system 100 can operate efficiently and effectively across the superconducting circuit chips in a synchronized manner, even at the high computational speeds of a superconducting environment.

Figure 2:
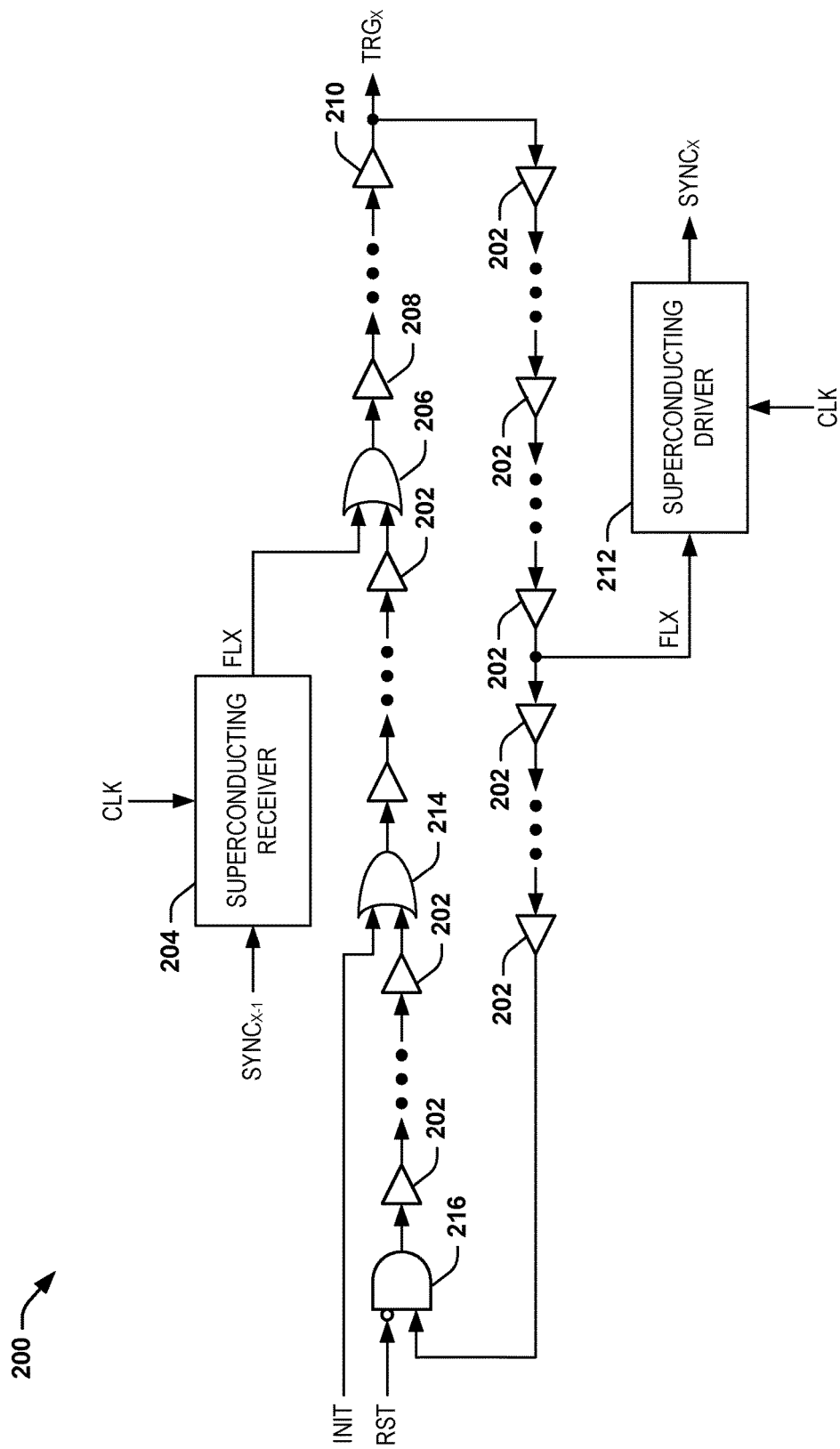
FIG. 2 illustrates an example diagram of a ring oscillator.

FIG. 2 illustrates an example diagram of a ring oscillator 200. The ring oscillator 200 can correspond to the ring oscillator 106 of one or more of the superconducting circuit chips 102 in the example of FIG. 1. Therefore, reference is to be made to the example of FIG. 1 in the following description of the example of FIG. 2. In the example of FIG. 2, the ring oscillator 200 can be the ring oscillator 106 of the Xth superconducting circuit chip 102, which can correspond to any one of the N superconducting circuit chips 102 in the example of FIG. 1.

The ring oscillator 200 is composed primarily of JTL segments 202 that are arranged in a loop. In the example of FIG. 2, each of the JTL segments 202 can be biased by a given phase of the clock signal CLK (not shown). For example, each JTL segment 202 can be biased by a phase of the clock signal CLK that is 90° subsequent to the phase of the clock signal CLK that biased the immediately preceding JTL segment 202. Therefore, a fluxon (e.g., an RQL fluxon and subsequent RQL anti-fluxon) can propagate about the loop via the JTL segments 202 at each of subsequent phases of the clock signal CLK.

The ring oscillator 200 includes a superconducting receiver 204 that is configured to receive the synchronization signal $SYNC_{X-1}$ that is provided from the ring oscillator 106 of the immediately preceding superconducting circuit chip 102 (e.g., the X−1 superconducting circuit chip 102) of the sequence. For example, the synchronization signal $SYNC_{X-1}$ can be provided from a PTL that interconnects the ring oscillator 106 of the X−1 superconducting circuit chip 102 and the ring oscillator 200. The superconducting receiver 204 can thus provide data capture (e.g., sample) the synchronization signal $SYNC_{X-1}$ from the PTL to generate a fluxon, demonstrated as a signal FLX, at a specific phase of the clock signal CLK. As an example, the specific phase of the clock signal CLK can be relative to both a specific known phase of transmission of the synchronization signal $SYNC_{X-1}$ and a length of the PTL with respect to the phases of the clock signal CLK. For example, the PTL on which the synchronization signal $SYNC_{X-1}$ propagates can have a known length for which a time of propagation of the synchronization signal $SYNC_{X-1}$ can likewise be known. Therefore, the propagation of the synchronization signal $SYNC_{X-1}$ can be related to the phases of the clock signal CLK, such that the phase of the clock signal CLK at which the superconducting receiver 204 receives the synchronization signal $SYNC_{X-1}$ can be the same or subsequent to the phase at which the synchronization signal $SYNC_{X-1}$ is generated from the ring oscillator 106 of the preceding superconducting circuit chip 102, as based on the length of the PTL.

The fluxon FLX generated by the superconducting receiver 204 can be provided as an input to an OR-gate 206. The OR-gate 206 therefore provides the fluxon FLX as an output (e.g., propagates the fluxon FLX) to a first JTL segment, demonstrated at 208, of the JTL segments 202. Therefore, in response to receiving the synchronization signal $SYNC_{X-1}$, the ring oscillator 200 can be activated. Thus, in response to the fluxon being introduced into the loop of JTL segments 202, the fluxon FLX can continue to propagate through the JTL segments 202 around the loop indefinitely, thereby providing a timing reference for the associated superconducting circuit chip 102 in which the ring oscillator 200 is included.

In addition, in the example of FIG. 2, the JTL segments 202 include a second JTL segment, demonstrated at 210, that is configured to provide the trigger signal $TRG_X$. As described above in the example of FIG. 1, the trigger signal $TRG_X$ can be provided to the superconducting circuitry 104 to facilitate circuit functions. The second JTL segment 210 can have a known phase relationship with respect to the first JTL segment 208. Additionally, as described above, the superconducting receiver 204 has a known phase relationship with the ring oscillator 106 of the preceding superconducting circuit chip 102 from which the synchronization signal $SYNC_{X-1}$ is provided. Therefore, because the first JTL segment 208 has a known phase relationship with the superconducting receiver 204, and because the superconducting receiver 204 has a known phase relationship with the ring oscillator 106 of the preceding superconducting circuit chip 102, then the trigger signal $TRG_X$ can have a known phase relationship with a trigger signal $TRG_{X-1}$ that is generated by the ring oscillator 106 of the preceding superconducting circuit chip 102. For example, based on the arrangement of the JTL segments 202 in the ring oscillator 200 and the arrangement of the JTL segments in the ring oscillator 106 in the preceding superconducting circuit chip 102, the trigger signal $TRG_X$ can be provided concurrently with the trigger signal $TRG_{X-1}$ that is generated by the ring oscillator 106 of the preceding superconducting circuit chip 102. Accordingly, the trigger signal $TRG_{X-1}$ and the trigger signal $TRG_X$ can be synchronized to synchronize circuit functions of the superconducting circuitry 104 of the respective superconducting circuit chips 102, as described herein.

The ring oscillator 200 includes a superconducting driver 212 that is configured to generate a synchronization signal $SYNC_X$ based on the fluxon FLX. The synchronization signal $SYNC_X$ can thus be provided on a PTL from the ring oscillator 200 to the next superconducting circuit chip 102 (e.g., the X+1 superconducting circuit chip 102) of the sequence. For example, the synchronization signal $SYNC_X$ can be provided on a PTL that interconnects the ring oscillator 200 to the ring oscillator 106 of the X+1 superconducting circuit chip 102. The superconducting receiver 204 can thus convert the fluxon FLX to a high voltage signal corresponding to the synchronization signal $SYNC_X$ that is provided on the PTL at a specific phase of the clock signal CLK. The synchronization signal $SYNC_X$ can thus be received by a superconducting receiver of the ring oscillator 106 of the X+1 superconducting circuit chip 102, such as similar to the superconducting receiver 204 described above.

As an example, the specific phase of the clock signal CLK can be relative to a specific known phase of the trigger signal $TRG_X$. Therefore, similar to as described above, transmission of the synchronization signal $SYNC_X$ and a length of the PTL with respect to the phases of the clock signal CLK can be related to the phase of the clock signal CLK on which the synchronization signal $SYNC_X$ can be received by the superconducting receiver of the ring oscillator 106 of the next superconducting circuit chip 102. Therefore, the propagation of the synchronization signal $SYNC_X$ can be related to the phases of the clock signal CLK on which a trigger signal $TRG_{X-1}$ can be generated by the ring oscillator 106 of the next superconducting circuit chip 102. As a result, similar to as described above, the trigger signal $TRG_X$ and the trigger signal $TRG_{X-1}$ can be synchronized to synchronize circuit functions of the superconducting circuitry 104 of the respective superconducting circuit chips 102, as described herein. The synchronization of the trigger signals TRG can thus be provided in a similar manner for all of the superconducting circuit chips 102 of the superconducting circuit system 100, as described herein.

In the example of FIG. 2, the ring oscillator 200 is demonstrated as receiving the initialization signal INIT. For example, the ring oscillator 200 can be configured as the ring oscillator 106 of the first superconducting circuit chip 102 (e.g., X=1). In this example, the initialization signal INIT can be provided to the ring oscillator 200 as an alternative of including the superconducting receiver 204. Therefore, the superconducting receiver 204 may be obviated in the first superconducting circuit chip 102, and the initialization signal INIT may be obviated in the rest of the superconducting circuit chips 102. The initialization signal INIT can thus provide an alternative of activation of the ring oscillator 200.

The initialization signal INIT is provided as an input to an OR-gate 214. The OR-gate 214 therefore provides the fluxon FLX as an output to the JTL segments 202. Therefore, in response to receiving the initialization signal INIT, the ring oscillator 200 can be activated. Thus, in response to the fluxon being introduced into the loop of JTL segments 202, the fluxon FLX can continue to propagate through the JTL segments 202 around the loop indefinitely, thereby providing a timing reference for the associated superconducting circuit chip 102 in which the ring oscillator 200 is included, similar to as described above.

The ring oscillator 200 is demonstrated as receiving the reset signal RST, as well. The reset signal RST is provided to an inverting input of an AND-gate 216. Therefore, in response to receiving the reset signal RST, the AND-gate 216 does not propagate the fluxon FLX, which can cease the indefinite propagation of the fluxon FLX about the loop of JTL segments 202. Accordingly, the reset signal RST can be implemented to deactivate the ring oscillator 200, similar to as described above. The ring oscillator 200 can be reactivated in response to receiving the synchronization signal $SYNC_{X-1}$ or the initialization signal INIT, as described above.

Figure 3:
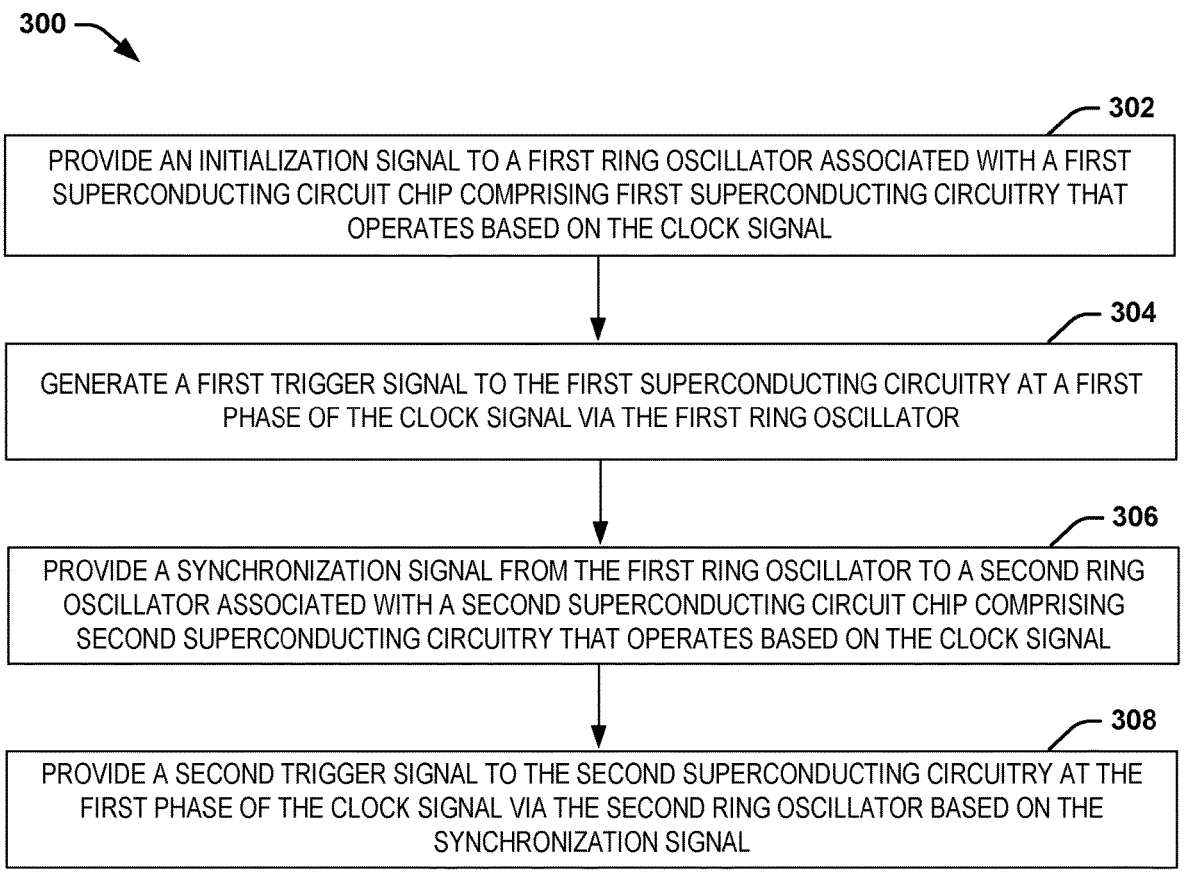
FIG. 3 illustrates an example of a method for synchronizing a plurality of superconducting chips.

In view of the foregoing structural and functional features described above, a methodology in accordance with various aspects of the disclosure will be better appreciated with reference to FIG. 3. It is to be understood and appreciated that the method of FIG. 3 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 3 illustrates an example of a method 300 for synchronizing a plurality of superconducting circuit chips (e.g., the superconducting circuit chips 102) to a clock signal (e.g., the clock signal CLK). At 302, an initialization signal (e.g., the initialization signal INIT) is provided to a first ring oscillator (e.g., a ring oscillator 106) associated with a first superconducting circuit chip comprising first superconducting circuitry (e.g., the superconducting circuitry 104) that operates based on the clock signal. At 304, a first trigger signal (e.g., the trigger signal $TRG_1$) is provided to the first superconducting circuitry at a first phase of the clock signal via the first ring oscillator. At 306, a synchronization signal (e.g., the synchronization signal $SYNC_1$) is provided from the first ring oscillator to a second ring oscillator associated with a second superconducting circuit chip comprising second superconducting circuitry that operates based on the clock signal. At 308, a second trigger signal (e.g., the trigger signal $TRG_2$) is provided to the second superconducting circuitry at the first phase of the clock signal via the second ring oscillator based on the synchronization signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting circuit chip comprising:
   first superconducting circuitry that operates based on a clock signal; and
   a first ring oscillator configured to receive a synchronization signal from a second ring oscillator associated with another superconducting circuit chip and to provide a first trigger signal to the first superconducting circuitry at a given phase of the clock signal relative to a phase of the clock signal at which a second trigger signal is provided to second superconducting circuitry associated with the other superconducting circuit chip based on the synchronization signal.

2. The chip of claim 1, wherein the other superconducting circuit chip is a first other superconducting circuit chip, wherein the synchronization signal is a first synchronization signal provided from the second ring oscillator associated with the first other superconducting circuit chip, wherein the first ring oscillator is further configured to provide a second synchronization signal to a third ring oscillator associated with a second other superconducting circuit chip, such that the third ring oscillator associated with the second other superconducting circuit chip is configured to provide a third trigger signal at a phase of the clock signal relative to the given phase of the clock signal.

3. The chip of claim 1, wherein the synchronization signal is provided from a passive transmission line (PTL) interconnecting the superconducting circuit chip and the other superconducting circuit chip.

4. The chip of claim 3, wherein the PTL has a length relative to a first phase of the clock signal at which the synchronization signal is generated from the ring oscillator associated with the other superconducting circuit chip to be received by the superconducting circuit chip at a second phase of the clock signal.

5. The chip of claim 1, wherein the first ring oscillator comprises a plurality of Josephson transmission line (JTL) segments configured to propagate a fluxon in a loop based on the clock signal.

6. The chip of claim 5, wherein the first ring oscillator further comprises a superconducting receiver that is configured to generate the fluxon in response to the synchronization signal at a specific phase of the clock signal.

7. The chip of claim 6, wherein the plurality of JTL segments comprises a first JTL segment configured to receive the fluxon at an input from the superconducting receiver and a second JTL segment configured to generate the trigger signal, wherein the second JTL segment is configured to generate the trigger signal at the given phase based on a phase relationship between the first and second JTL segments.

8. The chip of claim 5, wherein the other superconducting circuit chip is a first other superconducting circuit chip, wherein the synchronization signal is a first synchronization signal provided from the second ring oscillator associated with the first other superconducting circuit chip, wherein the ring oscillator further comprises a superconducting driver configured to generate a second synchronization signal that is provided to a third ring oscillator associated with a second other superconducting circuit chip, such that the third ring oscillator associated with the second other superconducting circuit chip is configured to provide a third trigger signal at a phase of the clock signal relative to the given phase of the clock signal based on the second synchronization signal.

9. The chip of claim 8, wherein the superconducting driver is configured to provide the second synchronization signal on a passive transmission line (PTL) interconnecting the superconducting circuit chip and the second other superconducting circuit chip on a first phase of the clock signal, wherein the PTL has a length relative to a first phase of the clock signal at which the second synchronization signal is generated to be received by the second other superconducting circuit chip at a second phase of the clock signal.

10. The chip of claim 5, wherein the ring oscillator further comprises a logic gate configured to receive an output of the one of the JTL segments as a first input, and to receive a reset signal as a second input, the reset signal being provided to deactivate the fluxon from propagating around the ring oscillator.

11. A method for synchronizing a plurality of superconducting circuit chips to a clock signal, the method comprising:
providing an initialization signal to a first ring oscillator associated with a first superconducting circuit chip comprising first superconducting circuitry that operates based on the clock signal;
generating a first trigger signal to the first superconducting circuitry at a first phase of the clock signal via the first ring oscillator;
providing a synchronization signal from the first ring oscillator to a second ring oscillator associated with a second superconducting circuit chip comprising second superconducting circuitry that operates based on the clock signal; and
providing a second trigger signal to the second superconducting circuitry at the first phase of the clock signal via the second ring oscillator based on the synchronization signal.

12. The method of claim 11, wherein providing the initialization signal comprises providing the initialization signal to the first ring oscillator to propagate a first fluxon in a first loop comprising a first plurality of Josephson transmission line (JTL) segments based on the clock signal, wherein providing the synchronization signal comprises providing the synchronization signal to the second ring oscillator to propagate a second fluxon in a second loop comprising a second plurality of JTL segments based on the clock signal.

13. The method of claim 12, wherein providing the synchronization signal comprises providing the synchronization signal from the first ring oscillator via a passive transmission line (PTL) interconnecting the first superconducting circuit chip and the second superconducting circuit chip, wherein the PTL has a length relative to a first phase of the clock signal at which the synchronization signal is generated from the first ring oscillator to be received by the second ring oscillator at a second phase of the clock signal.

14. The method of claim 13, wherein providing the synchronization signal comprises:
providing the first fluxon from a first JTL segment of the first plurality of JTL segments of the first ring oscillator; and
generating the synchronization signal at the first phase of the clock signal based on the first fluxon via a superconducting driver coupled to an output of the first JTL segment, wherein providing the synchronization signal comprises providing the synchronization signal from the superconducting driver on the PTL interconnecting the first superconducting circuit chip and the second superconducting circuit chip.

15. The method of claim 12, further comprising receiving the synchronization signal at a superconducting receiver associated with the second ring oscillator, wherein the second plurality of JTL segments comprises a first JTL segment configured to receive the second fluxon at an input from the superconducting receiver and a second JTL segment configured to generate the trigger signal, wherein the second JTL segment is configured to generate the trigger signal at the first phase based on a phase relationship between the first and second JTL segments.

16. A superconducting circuit synchronization system comprising:
a first superconducting circuit chip comprising first superconducting circuitry that operates based on a clock signal and a first ring oscillator, the first ring oscillator being configured to provide a synchronization signal and a first trigger signal, the first trigger signal being provided to the first superconducting circuitry at a given phase of the clock signal;
a second superconducting circuit chip comprising second superconducting circuitry that operates based on the clock signal and a second ring oscillator, the second ring oscillator being configured to receive the synchronization signal and to provide a second trigger signal, the second trigger signal being provided to the second superconducting circuitry at the given phase of the clock signal based on the synchronization signal; and
a synchronization controller configured to provide an initialization signal to the first ring oscillator of the first the superconducting circuit chip to activate the first ring oscillator.

17. The system of claim 16, wherein the first ring oscillator comprises a first plurality of Josephson transmission line (JTL) segments arranged in a first loop, the first JTL segments being configured to propagate a first fluxon around the first loop in response to the initialization signal, wherein the second ring oscillator comprises a second plurality of JTL segments arranged in a second loop, the second JTL segments being configured to propagate a second fluxon around the second loop in response to the synchronization signal.

18. The system of claim 17, further comprising a passive transmission line (PTL) interconnecting the first superconducting circuit chip and the second superconducting circuit chip, wherein the PTL has a length relative to a first phase of the clock signal at which the synchronization signal is generated from the first ring oscillator to be received by the second ring oscillator at a second phase of the clock signal.

19. The system of claim 18, wherein the first ring oscillator comprises:

a first JTL segment of the first plurality of JTL segments configured to generate the first fluxon; and a superconducting driver coupled to an output of the first JTL segment, the superconducting driver being configured to generate the synchronization signal at the first phase of the clock signal based on the first fluxon and to provide the synchronization signal on the PTL.

20. The system of claim 17, wherein the second ring oscillator comprises:

a superconducting receiver configured to receive the synchronization signal from the PTL and to generate the second fluxon at the second phase of the clock signal;

a first JTL segment of the second plurality of JTL segments configured to receive the second fluxon at an input from the superconducting receiver; and a second JTL segment of the second plurality of JTL segments configured to generate the trigger signal, wherein the second JTL segment is configured to generate the trigger signal at the given phase based on a phase relationship between the first and second JTL segments.

* * * * *